(12) United States Patent
Wang et al.

(10) Patent No.: US 9,448,285 B2
(45) Date of Patent: Sep. 20, 2016

(54) METHOD AND APPARATUS OF WAFER TESTING

(71) Applicant: Taiwan Semiconductor Manufacturing Company, Ltd., Hsin-Chu (TW)

(72) Inventors: Mill-Jer Wang, Hsin-Chu (TW); Ching-Nen Peng, Hsin-Chu (TW); Hung-Chih Lin, Hsin-Chu (TW); Hao Chen, Luzhou (TW); Shang-Ju Lee, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 491 days.

(21) Appl. No.: 13/915,409

(22) Filed: Jun. 11, 2013

(65) Prior Publication Data

US 2014/0361804 A1 Dec. 11, 2014

(51) Int. Cl.
*G01R 31/00* (2006.01)
*G01R 31/3185* (2006.01)
*G01R 31/28* (2006.01)

(52) U.S. Cl.
CPC ... *G01R 31/318511* (2013.01); *G01R 31/2889* (2013.01); *G01R 31/318513* (2013.01)

(58) Field of Classification Search
CPC .............. G01R 31/318511; G01R 31/2889
See application file for complete search history.

(56) References Cited

U.S. PATENT DOCUMENTS

| | | | | |
|---|---|---|---|---|
| 7,508,226 B2* | 3/2009 | Fredericksen | ......... | G01N 27/02 324/755.05 |
| 2002/0089341 A1* | 7/2002 | Hubner | .......... | G01R 31/318511 324/756.03 |
| 2008/0191683 A1* | 8/2008 | Mayder | ............ | G01R 31/31928 324/73.1 |

* cited by examiner

*Primary Examiner* — Tung X Nguyen
(74) *Attorney, Agent, or Firm* — Slater Matsil, LLP (57) ABSTRACT

A system for testing a wafer includes a probe card and a wafer. The probe card includes at least one first probe site and at least one second probe site. The wafer includes a plurality of dies. The at least one first probe site is arranged for a first test, and the at least one second probe site is arranged for a second test. Each of the plurality of dies corresponds to first probe pads and second probe pads. Each of the at least one first probe site is arranged to touch the first probe pads of each of the plurality of dies. Each of the at least one second probe site is arranged to touch the second probe pads of each of the plurality of dies.

18 Claims, 6 Drawing Sheets

METHOD AND APPARATUS OF WAFER TESTING

FIELD OF DISCLOSURE

The present disclosure is related to integrated circuit (IC) and, more particularly, to integrated circuit wafer testing.

BACKGROUND

In semiconductor integrated circuit (IC) manufacturing, wafers are tested during manufacturing and prior to shipment to ensure proper operation. Wafer testing is a testing technique where a temporary electrical connection is established between automatic test equipment (ATE) and dies formed on the wafer to demonstrate proper performance of the ICs.

Along with complexity improvement of circuit designs, rapid development of semiconductor fabrication processes, and demand for circuit performance, ICs have been developed with a three-dimensional (3D) structure to increase circuit performance. There are many different processes required to manufacture a 3DIC including grinding, etching, milling, various deposition techniques, and the like. These processes can generate charges on the manufactured devices. Due to the increasing requirements for more test patterns for a single die, the test time and test cost are dramatically increased.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Some embodiments have one or a combination of the following features and/or advantages. A system for testing a wafer includes a probe card and a wafer. The probe card includes at least one first probe site and at least one second probe site. The wafer includes a plurality of dies. The at least one first probe site is arranged for a first test, and the at least one second probe site is arranged for a second test. Each of the plurality of dies corresponds to first probe pads and second probe pads. Each of the at least one first probe site is arranged to touch the first probe pads of each of the plurality of dies. Each of the at least one second probe site is arranged to touch the second probe pads of each of the plurality of dies. One of the at least one first probe site touches the first probe pads of a die to perform the first test at a first time period, and one of the at least one second probe site touches the second probe pads of the die to perform the second test at a second time period.

Figure 1:
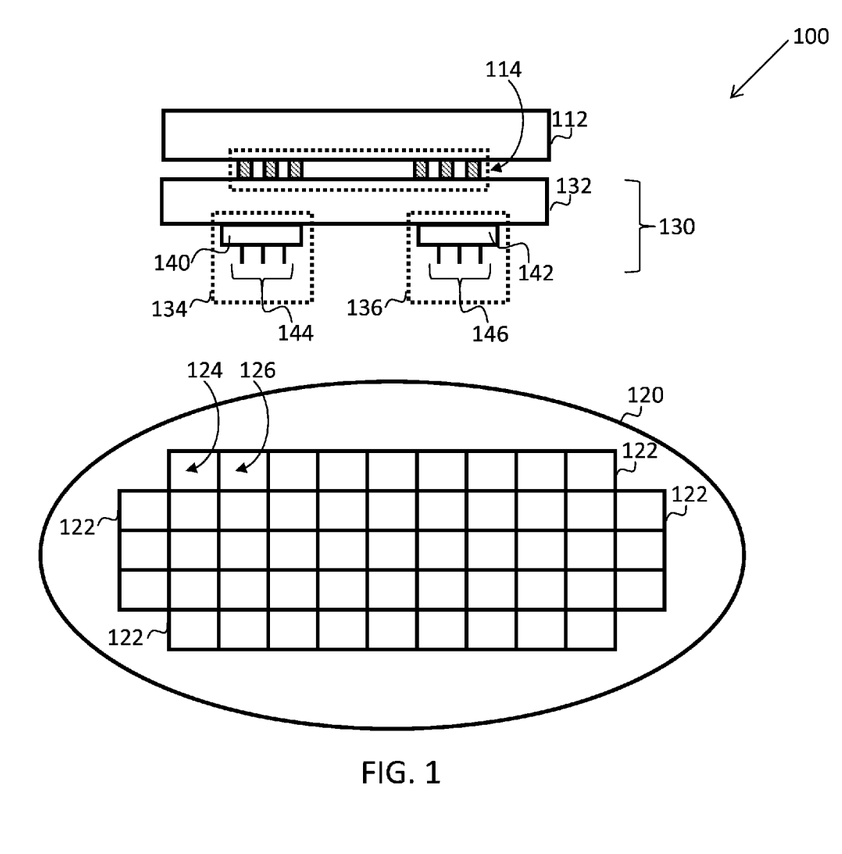
FIG. 1 is a system 100 of a wafer testing with a multi-site probe card in accordance with some embodiments.

FIG. 1 is a system 100 of a wafer testing with a multi-site probe card according to some example embodiments. The system 100 includes a test head 112 of a tester (not shown), a probe card 130, and a wafer 120, which is commonly called a wafer under test. A probe interface 114 is arranged to connect the test head 112 and the probe card 130. The probe card 130 includes a probe card printed circuit board (PCB) 132 and probe sites 134 and 136. The probe site 134 includes a probe card substrate and probe card head 140 and probe needles 144. The probe site 136 includes a probe card substrate and probe card head 142 and probe needles 146. The probe card substrate and probe card heads 140 and 142 are arranged to provide interconnection paths of signals and powers between the probe card PCB 132 and the probe needles 144 and 146, respectively.

Names for the probe card PCB 132, the probe sites 134, 136, the probe card substrate and probe card head 140, 142 and the probe needles 144, 146 are not intended to be limited, but rather are used for illustration purpose. Although the probe card 130 in FIG. 1 only shows two probe sites 134 and 136, any number of probe sites is within the scope of various embodiments. In some embodiments, a needle number and a footprint of the probe needles 144 in the probe site 134 are similar to a corresponding needle number and footprint of the probe needles 146 in the probe site 136. In some embodiments, the needle number and the footprint of the probe needles 144 in the probe site 134 are different from the needle number and the footprint of the probe needles 146 in the probe site 136. In some embodiments, the probe needles 144 and 146 are cantilever probes, Cobra needle probes, membrane bumps, and/or other probes compliant with contact technologies.

In a wafer test, test patterns are specified by users in the tester to perform a plurality of tests on dies of the wafer. Furthermore, the test patterns are configured to convert into power signals, control signals, data signals and clock signals. The power signals, control signals, data signals and clock signals are transmitted from the tester to the probe needles 144, 146 through the test head 112, the probe interface 114, the probe card PCB 132, and the probe card substrate and probe card head 140, 142.

Figure 3:
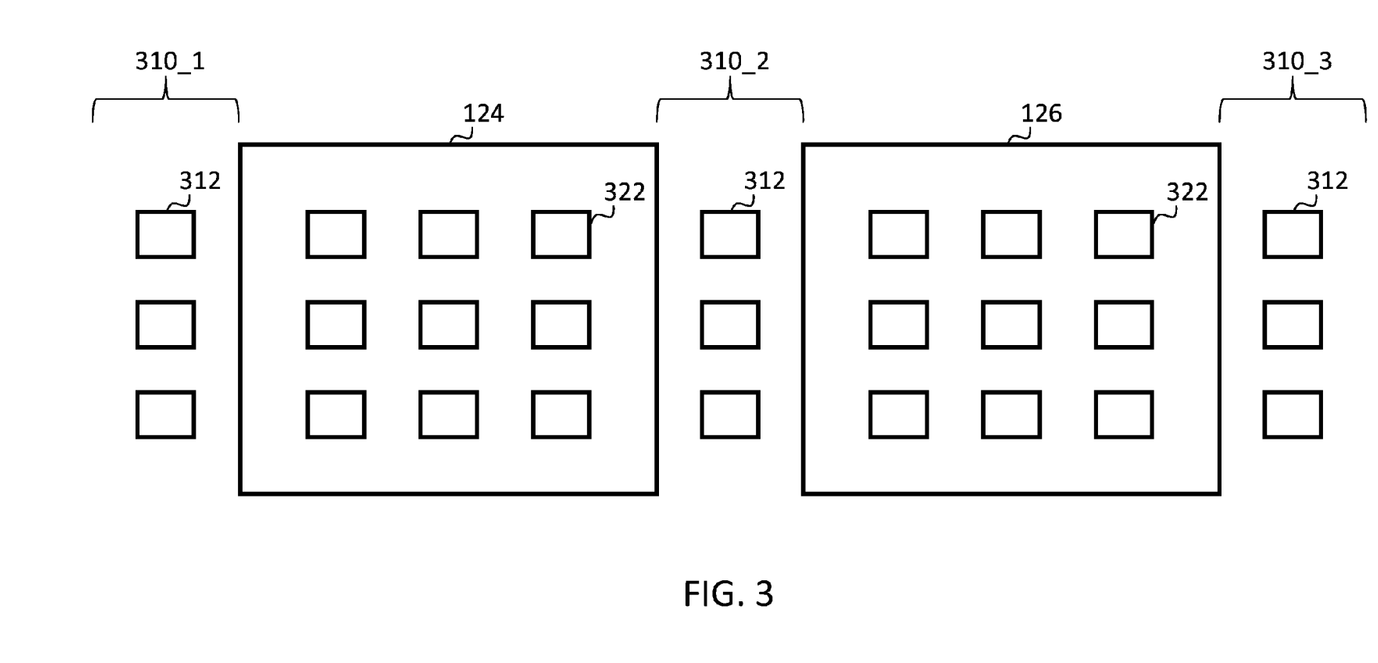
FIG. 3 a plan view of dies 124 and 126 of wafer 120 in FIG. 1 in details in accordance with some embodiments.

The wafer 120 includes a plurality of dies 122 and scribe regions (not shown in FIG. 1, see FIG. 3). The scribe regions are spaces in between the plurality of dies 122 of the wafer 120 in FIG. 1. The scribe regions enable the wafer 120 to be cut into physically separated dies 122 along the scribe region 310 without damaging the dies 122. For illustration purposes, only four dies 122 are labeled, and two adjacent dies are labeled as reference number 124 and 126, respectively. Each of the plurality of dies 122, 124 and 126 includes a plurality of probe pads (not shown). In some embodiments, bond pads are used in place of the probe pads. For simplicity, the terms probe pads and bond pads are used interchangeably and such use should not limit the scope of the claims appended herewith. In a wafer test, the probe needles 144 and 146 physically touch the corresponding probe pads of separated dies in the wafer 120. For example, the probe needles 144 and 146 physically touch the plurality of probe pads of the dies 124 and 126, respectively. The control signals, data signals, clock signals or power signals on the probe needles 144 and 146 are simultaneously transmitted to the corresponding probe pads on the dies 124 and 126, respectively, in the wafer 120. In such a situation, two kinds of tests are arranged to launch simultaneously on two dies in the same time period such that the overall testing time and cost are reduced.

In some embodiments, a footprint of probe needles of a probe site is a location arrangement of the probe needles of the probe site. Similarly, a footprint of probe pads is a location arrangement of the probe pads. A footprint of probe pads is also called a probe pad map.

In some embodiments, the probe site 136 is arranged for a first test such as ESD discharge, wafer level burn-in test, testline test, or the like. At the same time, the probe site 134 is arranged for a second test such as manufacture tests. The manufacture tests include functional tests, design-for-testability (DFT) test or the like.

Figure 2:
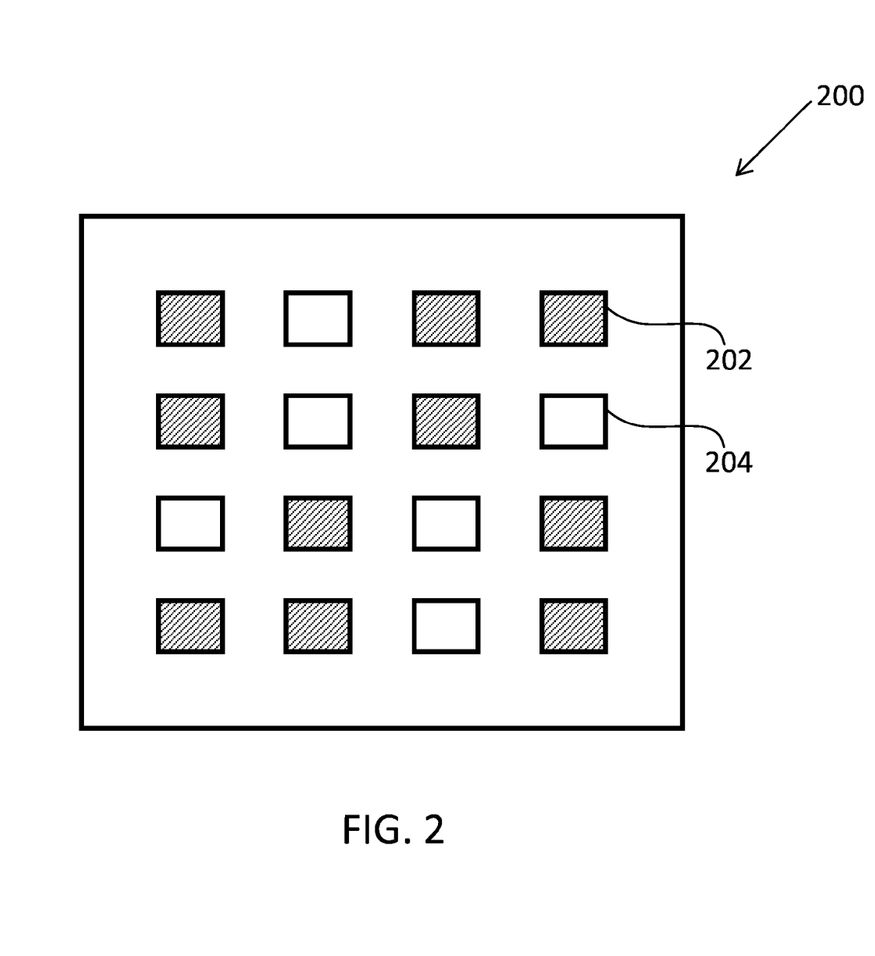
FIG. 2 is a plan view of a die 200 of the plurality of dies 122 in FIG. 1 in accordance with some embodiments.

FIG. 2 is a plan view of a die 200 of the plurality of dies 122 in FIG. 1 according to some example embodiments. The die 200 includes probe pads 202 and 204. For illustration, the probe pads 202 are each drawn as a grey box, and the probe pads 204 are each drawn as a white box. For illustration purposes, only one probe pad 202 and one probe pad 204 are labeled. Footprints of probe pads 202 and 204 are used for illustration purpose, and such use should not limit the scope of the claims appended herein. For illustration, the probe pads 202 are arranged for manufacture tests and the probe pads 204 are arranged for ESD discharge tests. In such a situation, the probe pads 202 are electrically connected to functional circuits (not shown) in the die 200. The footprint of the probe pads 202 for manufacture tests is similar to the footprint of the probe needles 144 of the probe site 134 in FIG. 1.

With respect to the ESD discharge of the probe pads 204, the probe pads 204 are electrically connected to wirings (not shown) such as power/ground buses, inputs/outputs, or the like. The footprint of the probe pads 204 for ESD discharge is similar to the footprint of the probe needles 146 of the probe site 136 in FIG. 1. In some embodiments, the tester is configured to provide −1V or +1V at the probe needles 146 of the probe site 136 to create an electrical path to the discharge ESD current. In some embodiments, the probe needles 146 of the probe site 136 are electrically connected through resistances to ground voltage.

At a first time period of testing the wafer 120 in FIG. 1, the probe needles 146 of the probe site 136 touch the probe pads 204 of the die 124 of the wafer 120. The ESD current on the interconnections of the die 124 is discharged from the probe pads 204 through the discharge path. At a second time period of testing the wafer 120, the probe needles 146 of the probe site 136 touch the probe pads 204 of the die 126 of the wafer 120, and the probe needles 144 of the probe site 134 touch the probe pads 202 of the die 124 of the wafer 120. In such a situation, the ESD current in the die 126 is discharged from the probe pads 204 through the discharge path, and the manufacture tests are performed on the die 124 at the same time period. Such test procedures continue to apply on the rest of the plurality of dies 122 of the wafer 120. Because two actions of the first test and the second test are performed in the same time period, the overall testing time and cost are reduced.

In some embodiments, the probe pads 204 in FIG. 2 are arranged for a wafer level burn-in test. Wafer level burn-in test is a temperature/bias reliability stress test in wafer level used to detect and screen out potential early life failures. In such a situation, the probe pads 204 are electrically connected to circuits (not shown) in the die 200 for the burn-in test. The footprint of the probe pads 204 is similar to the footprint of the probe needles 146 of the probe site 136 in FIG. 1 for the wafer level burn-in test. At a first time period of testing the wafer 120 in FIG. 1, the probe needles 146 of the probe site 136 touch the probe pads 204 of the die 124 of the wafer 120. The wafer level burn-in test is performed on the die 124 to detect potential early life failures. At a second time period of testing the wafer 120, the wafer level burn-in test is performed on the die 126, and the manufacture tests are performed on the die 124 at the same time period. The probe needles 146 of the probe site 136 touch the probe pads 204 of the die 126 of the wafer 120, and the probe needles 144 of the probe site 134 in FIG. 1 touch the probe pads 202 of the die 124 of the wafer 120.

FIG. 3 is a plan view of dies 124 and 126 of the wafer 120 in FIG. 1 according to some example embodiments. The dies 124 and 126 include probe pads 322, and only one probe pad 322 is labeled in each of the dies 124 and 126 for illustration purposes. In some embodiments, the probe pads 322 are arranged for manufacture tests. In such a situation, the probe pads 322 are electrically connected to functional circuits (not shown) in the dies 124 and 126. Moreover, a footprint of the probe pads 322 of the dies 124 and 126 is similar to the footprint of the probe needles 144 of the probe site 134 in FIG. 1.

FIG. 3 also includes scribe regions 310_1, 310_2, 310_3 beside the dies 124 and 126. Each of the scribe regions 310_1, 310_2, 310_3 includes probe pads 312. For illustration purposes, only one probe pads 312 in each of the scribe regions 310_1, 310_2, 310_3 is labeled. In some embodiments, the probe pads 312 are arranged for a testline test. The testline test includes measuring process characteristics, features and device performances, or the like. Test circuits for a testline test are arranged to position at the scribe regions 310_1, 310_2, 310_3 and are electrically connected to corresponding probe pads 312. A footprint of the probe pads 312 of the scribe regions 310_1, 310_2, 310_3 is similar to the footprint of the probe needles 146 of the probe site 136 in FIG. 1.

At a first time period of testing the wafer 120 in FIG. 1, the probe needles 146 of the probe site 136 in FIG. 1 touch the probe pads 312 of the scribe regions 310_1. Data provided by the test circuits positioned at the scribe regions 310_1 are obtained. At a second time period of testing the wafer 120, the probe needles 146 of the probe site 136 touch the probe pads 312 of the scribe regions 310_2, and the probe needles 144 of the probe site 134 touch the probe pads 322 of the die 124 in FIG. 3. In such a situation, data provided by the test circuits positioned at the scribe regions 310_2 are obtained, and the manufacture tests are performed on the die 124 at the same time period. Furthermore, the data of the test circuits positioned at the scribe regions 310_1 obtained at the first time period are arranged to fine-tune test patterns or test sequences of the manufacture tests performed on the die 124 at the second time period. In some embodiments, the test patterns are fine-tuned to replace at least one test pattern of the test patterns with another test pattern. In some embodiments, the test sequences are fine-tuned to change an order of the test patterns used in testing the wafer 120.

For example, retention test is one of the manufacture tests for embedded dynamic random access memory (eDRAM). The eDRAM includes eDRAM cells and each of the eDRAM cells includes a capacitance. Charge stored in the capacitances of the eDRAM cells may leak away after a period of time. As a result, the eDRAM cells are periodically refreshed to keep the data stored in the eDRAM intact. The retention test is arranged to check if the date stored in the eDRAM cells could last for a certain period of time until the next refresh. A die that fails to pass the retention test is classified as a bad die and the rest of the manufacture tests is no longer necessary to be performed on the die.

Capacitances are positioned at the scribe regions 310_1, 310_2, 310_3 and are electrically connected to corresponding probe pads 312. At a first time period of testing the wafer 120, the probe needles 146 of the probe site 136 in FIG. 1 touch the probe pads 312 of the scribe regions 310_1. At the same time, via the probe needles 146 of the probe site 136, the tester measures capacitance values of the capacitances positioned at the scribe region 310_1. The capacitance values of the capacitances provide indicators of process variation at a particular area. The data in the eDRAM cells could not last for a certain period of time if the capacitance values obtained at the first time period are less than a threshold, for example. At a second time period of testing the wafer 120, the manufacture tests are performed on the die 124 and the test sequences of the manufacture tests are adjusted or fine-tuned according to the capacitance values of the capacitances positioned at the scribe region 310_1 that is obtained at the first time period. For example, if the capacitance values obtained at the first time period is less than a threshold, the corresponding die has a high possibility to be a bad die. As a result, the test sequences used in the manufacture tests at the second time period are changed accordingly to perform the retention test on the die 124 first. If the retention test fails, the rest of the manufacture tests is no longer necessary to be performed. Consequently, overall test time and cost are reduced.

In some embodiments, the test patterns used in the manufacture tests at the second time period are replaced if the capacitance values obtained at the first time period is less than a threshold. For example, the test patterns used in the manufacture tests are replaced with patterns of process feature characterizations. The patterns of process feature characterizations are configured to collect information regarding processes. Furthermore, the patterns of process feature characterizations are arranged to measure process characteristics, device performances, or the like to help determine failure causes.

Figure 4:
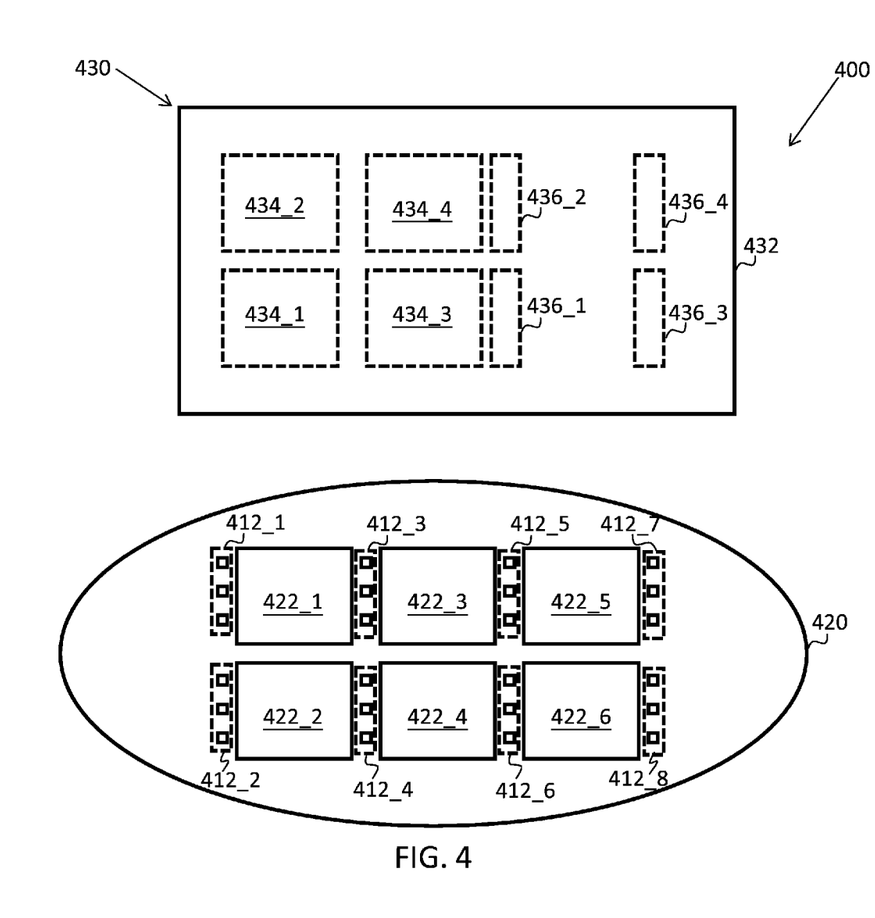
FIG. 4 is a system 400 of a wafer testing with a multi-site probe card in accordance with some embodiments.

FIG. 4 is a system 400 of a wafer testing with a multi-site probe card according to some example embodiments. The system 400 includes a probe card 430 and a wafer 420. Similar to wafer 120, wafer 420 is also called a wafer under test. The probe card 430 is shown with a bottom view and includes a probe card PCB 432 and probe sites 434_1-434_4, 436_1-436_4. Each of the probe sites 434_1-434_4, 436_1-436_4 includes similar components and structures as the corresponding ones of the probe sites 134 and 136 in FIG. 1. Although the probe card 430 in FIG. 4 only shows eight probe sites 434_1-434_4, 436_1-436_4, any number of probe sites is within the scope of various embodiments. In some embodiments, the probe sites 434_1-434_4 are arranged for manufacture tests, while the probe sites 436_1-436_4 are arranged for testline tests.

The wafer 420 includes dies 422_1-422_6. Each of the dies 422_1-422_6 includes a plurality of probe pads (not shown) that are electrically connected to functional circuits (not shown) in corresponding die for the purposes of manufacture tests. Furthermore, the wafer 420 also includes probe pads 412_1-412_8 positioned at corresponding nearby scribe regions. The probe pads 412_1-412_8 are electrically connected to test circuits positioned in corresponding scribe regions for the purposes of a testline test. Although the wafer 420 only shows six dies 422_1-422_6 and eight probe pads 412_1-412_8, any number of dies and probe pads is within the scope of various embodiments.

At a first time period of testing the wafer 420, the probe needles of the probe sites 436_1-436_4 simultaneously touch the probe pads 412_1-412_4, respectively. Data provided by the test circuits positioned at corresponding four scribe regions are obtained. In such a situation, the obtained data represent process characteristics and features in a specified area. In some embodiments, the testline test fails at a specified area when the obtained data does not reach a predefined threshold. At a second time period of testing the wafer 420, the probe needles of the probe sites 436_1-436_4 simultaneously touch the probe pads 412_5-412_8, respectively. Further, the probe needles of probe sites 434_1-434_4 simultaneously touch the probe pads of the dies 422_1-422_4, respectively. The data obtained at the first time period are arranged to fine-tune test patterns or test sequences of the manufacture tests performed on the dies 422_1-422_4 at the second time period.

In some embodiments, additional test patterns are arranged to test the dies 422_1-422_4 at the second time period when the testline test fails at the first time period or any of the dies 422_1-422_4 fails the manufacture tests at the second time period. In some embodiments, the additional test patterns include process features characterizations of the dies 422_1-422_4 to help determine failure causes.

Figure 5:
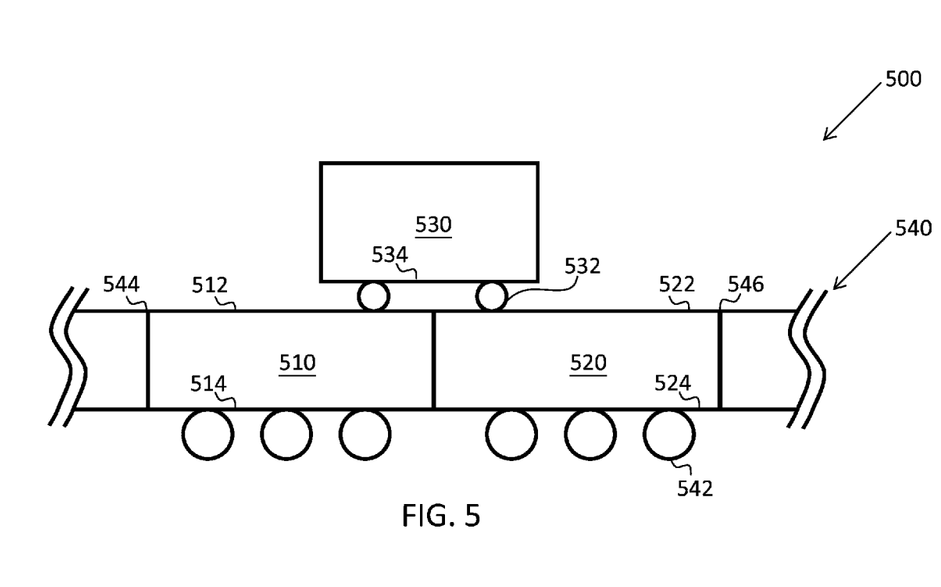
FIG. 5 is a cross-sectional view of a wafer level stack 500 in accordance with some embodiments.

FIG. 5 is a cross-sectional view of a wafer level stack 500 according to some example embodiments. The wafer level stack 500 includes a wafer 540 and a die 530. The wafer 540 includes a plurality of dies such as dies 510 and 520. In some embodiments, the dies 510 and 520 are identical dies. For example, the dies 510 and 520 are interposers, and combinations of the dies 510 and 520 are arranged to provide more interconnections and passive devices for the stacked die 530. In such a situation, the dies 510 and 520 are arranged to test at the same time period such that test coverage of the interconnections and devices connected to the die 530 can reach a predefined criteria for mass production, for example. Although the wafer level stack 500 only shows two dies 510 and 520 in the wafer 540 and one stacked die 530, any number of dies in the wafer and any number of stacked dies are within the scope of various embodiments.

Surfaces 512, 514 of the die 510, surfaces 522, 524 of the die 520 and surface 534 of the die 530 include bond pads (not shown). The die 530 is arranged to stack, through bumps 532, on the bond pads of the surfaces 512 and 522 of the dies 510 and 520, respectively. The bumps 542 are arranged to generate on the surfaces 514 and 524 of the dies 510 and 520, respectively. For illustration purposes, only one bump 532 and one bump 542 are labeled. Although the wafer level stack 500 only shows two bumps 532 and six bump 542, any number of bumps 532 and bumps 542 are within the scope of various embodiments. A die stack that includes dies 510-530 is arranged to be cut into physically separated die stack along scribe regions 544 and 546.

Figure 6:
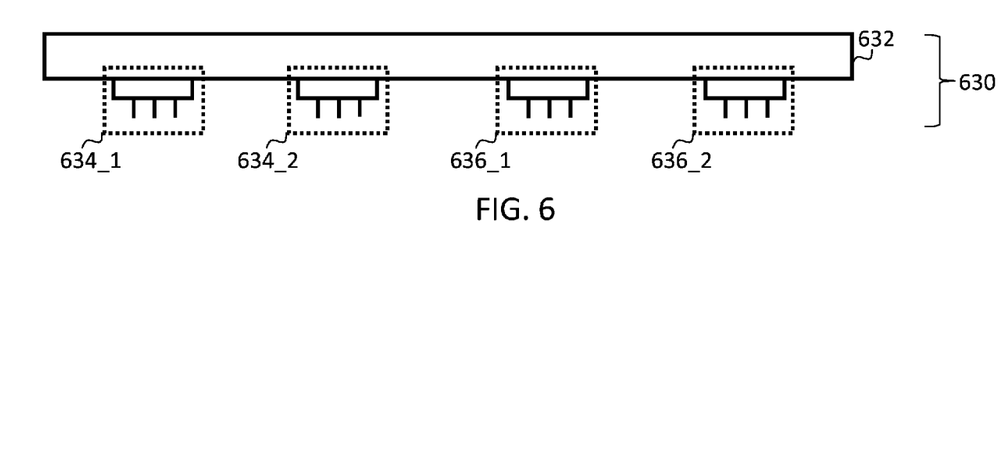
FIG. 6 is a probe card 630 to test wafer 540 or wafer level stack 500 in FIG. 5 in accordance with some embodiments.

FIG. 6 is a probe card 630 to test wafer 540 or wafer level stack 500 in FIG. 5 according to some example embodiments. The probe card 630 includes a probe card PCB 632 and probe sites 634_1, 634_2, 636_1 and 636_2. Each of the probe sites 634_1, 634_2, 636_1 and 636_2 includes similar components and structures as the corresponding ones of the probe sites 134 and 136 in FIG. 1. Although the probe card 630 only shows four probe sites 634_1, 634_2, 636_1 and 636_2, any number of probe sites is within the scope of various embodiments. In some embodiments, the probe sites 636_1 and 636_2 are arranged for a first test such as ESD discharge, burn-in test, testline tests or the like, while the probe sites 634_1 and 634_2 are arranged for a second test such as manufacture tests.

In some embodiments, the wafer 540 in FIG. 5 is arranged to be tested before the die 530 is stacked on dies 510 and 520, which is called a pre-bond test. At a first time period, the probe needles of the probe sites 636_1 and 636_2 touch the bond pads on the surfaces 512 and 522 of the dies 510 and 520, respectively, to perform a first test. At a second time period, the probe needles of the probe sites 636_1 and 636_2 touch the bond pads of the other dies in the wafer 540 to perform the first test, and the probe needles of the probe sites 634_1 and 634_2 touch the bond pads on the surfaces 512 and 522 of the dies 510 and 520, respectively, to perform a second test. In some embodiments, a footprint of the bond pads used for the second test is different from a footprint used for the first test.

In some embodiments, the wafer 540 in FIG. 5 is arranged to be tested after the die 530 is stacked on dies 510 and 520, which is called a post-bond test. At a first time period, the probe needles of the probe sites 636_1 and 636_2 touch the bumps on the surfaces 514 and 524 of the dies 510 and 520, respectively, to perform a first test. At a second time period, the probe needles of the probe sites 636_1 and 636_2 touch the bumps of the other dies in the wafer 540 to perform the first test, and the probe needles of the probe sites 634_1 and 634_2 touch the bumps on the surfaces 514 and 524 of the dies 510 and 520, respectively, to perform a second test. In some embodiments, a footprint of the bumps used for the second test is different from a footprint used for the first test.

Figure 7:
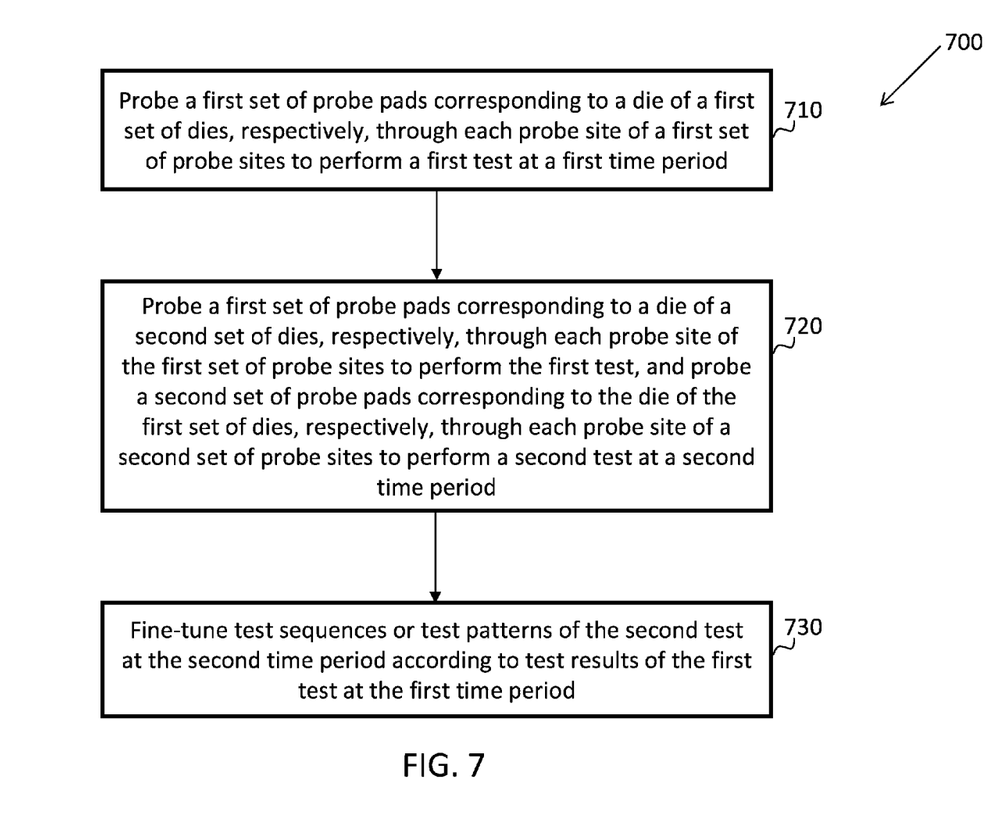
FIG. 7 illustrates a flow chart 700 of a wafer testing method of the structures in FIG. 1-6 in accordance with some embodiments.

FIG. 7 illustrates a flow chart 700 of a method of testing wafer based on the structures in FIGS. 1-6 according to some example embodiments.

In operation 710, each probe site of a first set of probe sites probes a first set of probe pads corresponding to a die of a first set of dies, respectively, to perform a first test at a first time period. For example, in FIGS. 1 and 2, the probe needles 146 of the probe site 136 in FIG. 1 touch the probe pads 204 in FIG. 2 of the die 124 of the wafer 120 in FIG. 1 to perform ESD discharge at a first time period. The ESD current of the die 124 is discharged from the probe pads 204 through the discharge path. For another example, in FIG. 4, the probe needles of the probe sites 436_1-436_4 simultaneously touch the probe pads 412_1-412_4 corresponding to the dies 422_1-422_4, respectively, to perform a testline test at a first time period.

In some embodiments, probe pads are used for a die if locations of the probe pads are near the die. In some embodiments, probe pads are used for a die if locations of the probe pads are within the die.

In operation 720, each probe site of the first set of probe sites probes a first set of probe pads corresponding to a die of a second set of dies, respectively, to perform the first test as illustrated in operation 710. Similarly, each probe site of a second set of probe sites probes a second set of probe pads corresponding to the die of the first set of dies to perform a second test at a second time period. For example, in FIGS. 1 and 2, the probe needles 146 of the probe site 136 in FIG. 1 touch the probe pads 204 in FIG. 2 of the die 126 of the wafer 120 in FIG. 1 to perform ESD discharge. Further, the probe needles 144 of the probe site 134 in FIG. 1 touch the probe pads 202 in FIG. 2 of the die 124 of the wafer 120 to perform manufacture tests at a second time period. In such a situation, the ESD current in the die 126 is discharged from the probe pads 204 through the discharge path, and the manufacture tests are performed on the die 124 at the same time period.

For another example, the probe needles of the probe sites 436_1-436_4 simultaneously touch the probe pads 412_5-412_8 of another four dies, respectively, to perform a testline test, and the probe needles of probe sites 434_1-434_4 simultaneously touch the probe pads of the dies 422_1-422_4, respectively, to perform manufacture tests at a second time period.

In operation 730, test sequences or test patterns of the second test at the second time period are fine-tuned according to test results of the first test at the first time period. For example, in FIG. 3, the data provided by the test circuits positioned at the scribe regions 310_1 obtained at the first time period are arranged to fine-tune test sequences or test patterns of the manufacture tests performed on the die 124 at the second time period. For another example, in FIG. 4, the data of test circuits connected to the probe pads 412_1-412_4 obtained at the first time period are arranged to fine-tune test sequences or test patterns of the manufacture tests performed on the dies 422_1-422_4 at the second time period.

In some embodiments, a probe card includes at least one first probe site and at least one second probe site. Each of the at least one first probe site includes first probe needles, and is arranged for a first test of a die. Each of the at least one second probe site includes second probe needles, and is arranged for a second test of the die. A footprint of the first probe needles is different from a footprint of the second probe needles.

In some embodiments, a system for testing a wafer includes a probe card and a wafer. The probe card includes at least one first probe site and at least one second probe site. The wafer includes a plurality of dies. The at least one first probe site is arranged for a first test, and the at least one second probe site is arranged for a second test. Each of the plurality of dies corresponds to first probe pads and second probe pads. Each of the at least one first probe site is arranged to touch the first probe pads corresponding to each of the plurality of dies. Each of the at least one second probe site is arranged to touch the second probe pads corresponding to each of the plurality of dies.

In some embodiments, a method of configuring a wafer test includes probing a first set of probe pads corresponding to a die of a first set of dies through each probe site of a first set of probe sites to perform a first test at a first time period. The method also includes probing a first set of probe pads corresponding to a die of a second set of dies through each probe site of the first set of probe sites to perform the first test, and probing a second set of probe pads corresponding to the die of the first set of dies through each probe site of a second set of probe sites to perform a second test at a second time period.

The sequences of the operations in the flow chart 700 are used for illustration purpose. Moreover, the sequences of the operations in the flow chart 700 can be changed. Some operations in the flow chart 700 can be skipped, and/or other operations can be added without limiting the scope of claims appended herewith.

While the disclosure has been described by way of examples and in terms of disclosed embodiments, the present disclosure is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. A probe card, comprising:
    at least one first probe site; and
    at least one second probe site;
    wherein:
        each of the at least one first probe site includes first probe needles, and is arranged for a first test of a die;
        each of the at least one second probe site includes second probe needles, and is arranged for a second test of the die; and
        a footprint of the first probe needles is different from a footprint of the second probe needles;
    wherein the first probe needles of one of the at least one first probe site touch first probe pads of the die to perform the first test at a first time period, and the second probe needles of one of the at least one second probe site touch second probe pads of the die to perform the second test at a second time period.

2. The probe card of claim 1, wherein probe pads touched by the first probe needles for the first test and the second probe needles for the second test are within the die.

3. The probe card of claim 1, wherein probe pads touched by the first probe needles for the first test are outside the die.

4. The probe card of claim 1, wherein test results of the first test performed at the first time period are arranged to fine-tune test sequences and/or test patterns of the second test performed at the second time period.

5. The probe card of claim 1, wherein each of the at least one first probe site and the at least one second probe site is arranged to touch bumps on a surface of a wafer level stack to perform a post-bond test.

6. The probe card of claim 1, wherein the number of the at least one first probe site is equal to the number of the at least second probe site.

7. A system for testing a wafer, comprising:
    a probe card including at least one first probe site and at least one second probe site; and
    a wafer including a plurality of dies;
    wherein:
        the at least one first probe site is arranged for a first test, and the at least one second probe site is arranged for a second test different from the first test;
        each of the plurality of dies includes first probe pads and second probe pads;
        each of the at least one first probe site is arranged to touch respective first probe pads of the plurality of dies; and
        each of the at least one second probe site is arranged to touch respective second probe pads of the plurality of dies;
    wherein one of the at least one first probe site touches the first probe pads of a die to perform the first test at a first time period, and one of the at least one second probe site touches the second probe pads of the die to perform the second test at a second time period.

8. The system of claim 7, wherein a footprint of the at least one first probe site is different from a footprint of the at least one second probe site.

9. The system of claim 7, wherein test results of the first test performed at the first time period are arranged to fine-tune test sequences and/or test patterns of the second test performed at the second time period.

10. The system of claim 7, wherein a footprint of the first probe pads is different from a footprint of the second probe pads.

11. The system of claim 7, wherein the first probe pads of one of the plurality of dies are outside the corresponding die.

12. The system of claim 7, wherein the first probe pads and the second probe pads of one of the plurality of dies are in the corresponding die.

13. The system of claim 7, wherein the number of the at least one first probe site is equal to the number of the at least second probe site.

14. A method of configuring a wafer testing, comprising:
    probing a first set of probe pads corresponding to a die of a first set of dies through each probe site of a first set of probe sites to perform a first test at a first time period; and
    probing a first set of probe pads corresponding to a die of a second set of dies through each probe site of the first set of probe sites to perform the first test, and probing a second set of probe pads corresponding to the die of the first set of dies through each probe site of a second set of probe sites to perform a second test at a second time period.

15. The method of claim 14, further comprising fine-tuning test sequences or test patterns of the second test at the second time period according to test results of the first test at the first time period.

16. The method of claim 14, wherein a footprint of each of the first set of probe sites is different from a footprint of each of the second set of probe sites.

17. The method of claim 14, wherein a footprint of each of the first set of probe pads is different from a footprint of each of the second set of probe pads.

18. The method of claim 14, wherein the first set of probe pads of each of the first set of dies and the second set of dies are outside the corresponding die.

* * * * *